(12) United States Patent
Breymesser et al.

(10) Patent No.: US 9,219,020 B2
(45) Date of Patent: Dec. 22, 2015

(54) SEMICONDUCTOR DEVICE, WAFER ASSEMBLY AND METHODS OF MANUFACTURING WAFER ASSEMBLIES AND SEMICONDUCTOR DEVICES

(75) Inventors: Alexander Breymesser, Villach (AT); Andre Brockmeier, Villach (AT); Francisco Javier Santos Rodriguez, Villach (AT); Hans-Joachim Schulze, Taufkirchen (DE); Carsten von Koblinski, Bodensdorf (AT); Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 13/415,340

(22) Filed: Mar. 8, 2012

(65) Prior Publication Data
US 2013/0234297 A1 Sep. 12, 2013

(51) Int. Cl.
| | | |
|---|---|---|
| *H01L 21/00* | (2006.01) | |
| *H01L 23/31* | (2006.01) | |
| *H01L 21/20* | (2006.01) | |
| H01L 21/56 | (2006.01) | |
| H01L 21/762 | (2006.01) | |

(52) U.S. Cl.
CPC ........ *H01L 23/3178* (2013.01); *H01L 21/2007* (2013.01); *H01L 21/56* (2013.01); *H01L 21/76224* (2013.01); *H01L 2924/0002* (2013.01)

(58) Field of Classification Search
USPC ......................................... 438/113, 114, 462
See application file for complete search history.

(56) References Cited

U.S. PATENT DOCUMENTS

| | | | |
|---|---|---|---|
| 3,369,290 A | 2/1968 | Mayer et al. | |
| 3,695,956 A | 10/1972 | Spears | |
| 5,767,578 A * | 6/1998 | Chang et al. | 257/717 |
| 5,773,874 A | 6/1998 | Einthoven | |
| 8,168,527 B2 * | 5/2012 | Lin et al. | 438/614 |
| 2004/0038480 A1* | 2/2004 | Moore et al. | 438/257 |
| 2006/0001128 A1* | 1/2006 | Tamura et al. | 257/644 |
| 2006/0038206 A1 | 2/2006 | Shimoyama et al. | |
| 2011/0272777 A1* | 11/2011 | Huang et al. | 257/510 |
| 2012/0012994 A1 | 1/2012 | Von Koblinski et al. | |

FOREIGN PATENT DOCUMENTS

| | | |
|---|---|---|
| CN | 1455234 A | 11/2003 |
| CN | 1715850 A | 1/2006 |
| CN | 101488484 A | 7/2009 |
| DE | 102005038152 A1 | 3/2006 |
| DE | 102006009961 A1 | 10/2006 |
| EP | 1359402 A1 | 11/2003 |

OTHER PUBLICATIONS

"Foturan—a photostructurable glass." pp. 1-3. mikroglas chemtech GmbH. Mainz, Germany.

* cited by examiner

*Primary Examiner* — Angel Roman
(74) *Attorney, Agent, or Firm* — Murphy, Bilak & Homiller, PLLC

(57) ABSTRACT

A cavity is formed in a working surface of a substrate in which a semiconductor element is formed. A glass piece formed from a glass material is bonded to the substrate, and the cavity is filled with the glass material. For example, a pre-patterned glass piece is used which includes a protrusion fitting into the cavity. Cavities with widths of more than 10 micrometers are filled fast and reliably. The cavities may have inclined sidewalls.

24 Claims, 11 Drawing Sheets

SEMICONDUCTOR DEVICE, WAFER ASSEMBLY AND METHODS OF MANUFACTURING WAFER ASSEMBLIES AND SEMICONDUCTOR DEVICES

BACKGROUND

For forming dielectric structures on semiconductor devices, conventionally oxides or nitrides are deposited or thermally grown on an underlying oxidizable material. Insulating structures extending into a semiconductor substrate may be formed by etching trenches into the semiconductor substrate and filling the trenches with deposited insulating materials, for example silicon oxide, thermally grown oxide or dielectric polymers. Such methods may be used to fill trenches up to a width of several micrometers.

It is desirable to provide a further method of providing semiconductor devices with dielectric structures.

SUMMARY

According to an embodiment referring to a method of manufacturing a semiconductor device, a cavity is formed in a working surface of a substrate in which a semiconductor element is formed. A glass piece formed from a glass material is bonded to the substrate, wherein the cavity is at least partly filled with the glass material.

According to another embodiment, a wafer assembly comprises a semiconductor element formed in a substrate with a cavity formed in a working surface. A glass piece that consists of or comprises a protrusion portion that at least partly fills the cavity is bonded to the substrate.

According to a further embodiment, a semiconductor device comprises a semiconductor element that is formed in a single-crystalline semiconductor die that has a working surface. A rear side surface is opposite to the working surface. An edge surface connects the working and rear side surfaces. The semiconductor device further comprises a glass piece consisting of or comprising a protrusion portion extending from the working surface into the semiconductor die or along the edge surface of the semiconductor die.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

Figure 1A:
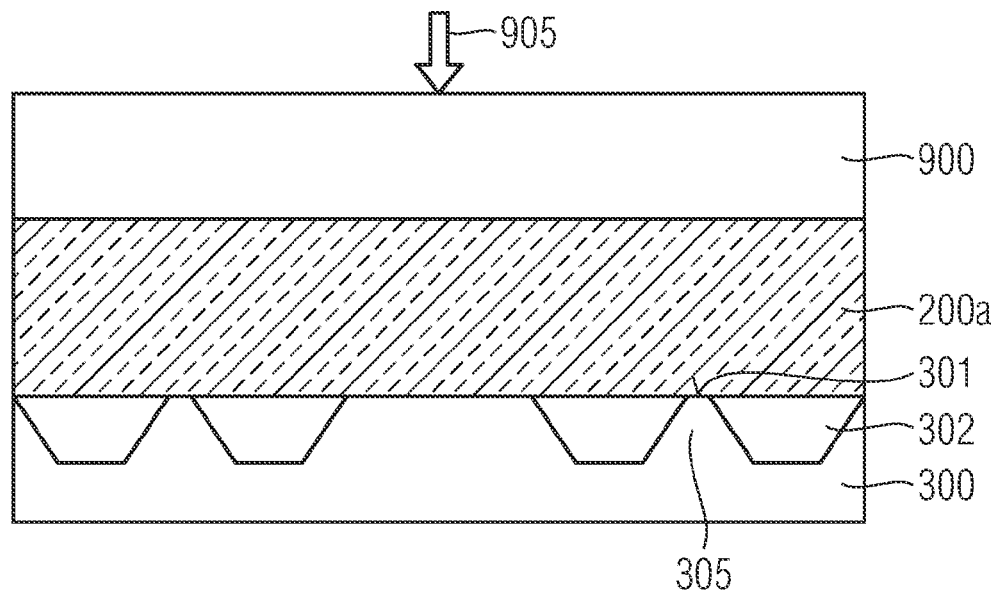
FIG. 1A is a schematic cross-sectional view of an arrangement including a glass piece formed from a glass material and a single-crystalline semiconductor device for illustrating a method of manufacturing a semiconductor device according to an embodiment using a flat glass disk.

FIG. 1A refers to a method of manufacturing a semiconductor device. A semiconductor element 305 is formed in a substrate 300. The substrate 300 may be a pre-processed single-crystalline semiconductor substrate 300, for example a single-crystalline silicon wafer, or a silicon-on-insulator wafer. The substrate 300 may comprise further doped and undoped sections or epitaxial semiconductor layers and insulating structures. In the following the substrate 300 is referred to as semiconductor substrate regardless of the presence of any non-semiconducting portions.

The semiconductor element 305 may be a transistor, for example a power field effect transistor, an IGBT (Insulated Gate Bipolar Transistor) or a diode. The semiconductor substrate 300 may include further semiconductor elements forming logic circuits, driver circuits, processor circuits or memory circuits. One or more cavities 302 extend from a working surface 301 into the semiconductor substrate 300. A glass material 200a is arranged in contact with the semiconductor substrate 300.

The method may use glass material 200a in the form of a powder, glass frits, glass pellets or a flat glass disk. The glass material 200a may be an inorganic glass, for example a soda-lime glass, undoped silica glass or doped silica glass, wherein the dopant or the dopants may be boron B, sodium Na, calcium Ca, potassium K and/or aluminum Al. According to another embodiment, the glass material 200a is a polymer, for example polynorbornene, polystyrene, polycarbonate, polyimide, or benzocyclobutene. The glass material 200a may exhibit a glass transition, wherein the glass material 200a fluidifies when the temperature of the glass material 200a exceeds its glass transition temperature.

Figure 1B:
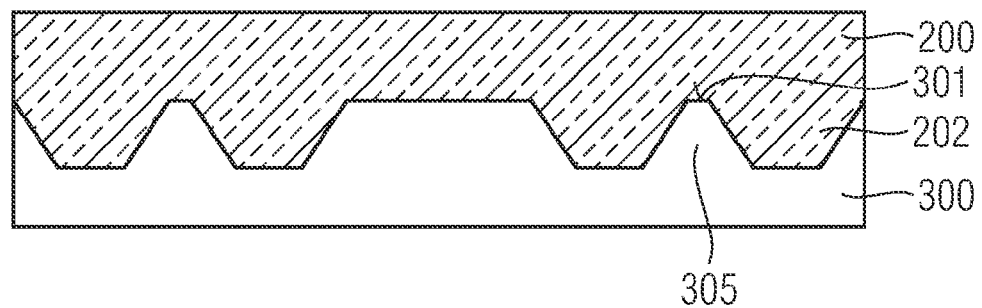
FIG. 1B is a schematic cross-sectional view of a wafer assembly emerging from the method as illustrated in FIG. 1A.

The glass material 200a is arranged in contact with a working surface 301 of the semiconductor substrate 300. The glass material 200a and the semiconductor substrate 300 are pressed against each other. For example, the glass piece 200a is pressed against the working surface 301 of the semiconductor substrate 300. Before or during pressing, the glass material 200a is fluidified. For example, during pressing, a temperature of the glass material 200a and a force exerted on the glass material 200a are controlled such that at least some of the glass material 200a fluidifies. For example, when the temperature exceeds the glass transition temperature, the fluidified glass material flows into the cavity 302 in the semiconductor substrate 300 and at least partly or completely fills the cavity 302. The temperature and the force are controlled such that the fluidified glass material 200a re-solidifies. The re-solidified glass material forms a glass piece 200 with a protrusion 202 that extends into or completely fills the cavity 302 of the semiconductor substrate 300 as shown in FIG. 1B.

The glass piece 200 is in-situ bonded to the semiconductor substrate 300. In order to achieve an in-situ bond of the glass piece 200 with the underlying materials a certain temperature and (external) pressure profile is necessary, whereas the glass transition temperature (Tg) may be the lower border for the applied maximum temperature. For example, the glass transition temperature of soda-lime glass is in the range of 520 to 600 degree Celsius and the glass transition temperature of polynorbornene is 215 degree Celsius.

A plate 900 may be used to exert the force 905 pressing the glass material 200a against the working surface 301 of the semiconductor substrate 300. The material of the plate 900 may be a material that forms a laminated or a bonded composite with the glass piece 200. According to another embodiment, the plate 900 is formed from a material that does not bond with the glass piece 200 (e.g. boron nitride, titanium nitride, platinum-iridium alloys) and that can be easily separated from the glass piece 200 after bonding the glass piece 200 to the semiconductor substrate 300.

The cavity 302 formed in the working surface 301 of the semiconductor substrate 300 may have a slope angle with regard to the working surface 301 of less than 80 degree, for example in the range of 40 to 60 degree. According to an embodiment, the slope angle of the cavity 302 is about 45 degree. The portion of the glass piece 200 filling the cavity 302 may be used as an edge construction of a high voltage semiconductor device. According to another embodiment, the isolation structure may be an internal insulating structure of an integrated circuit formed in the semiconductor substrate 300, wherein a slope angle may be between 40 and 90 degree, for example.

Figure 2A:
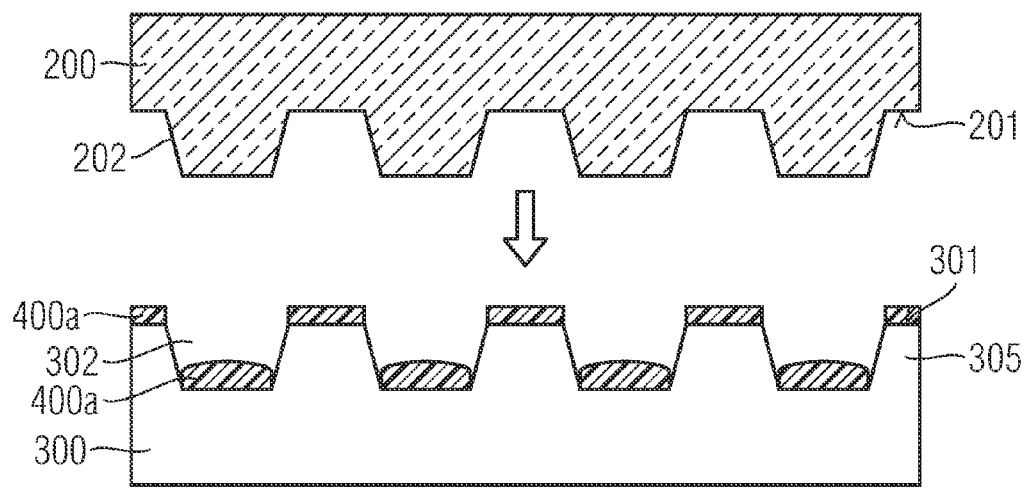
FIG. 2A is a schematic cross-sectional view of an arrangement including a pre-pattered glass piece formed from a glass material and a single-crystalline semiconductor device for illustrating a method of manufacturing a semiconductor device according to an embodiment using a pre-patterned glass piece and an adhesive layer.
Figure 2B:
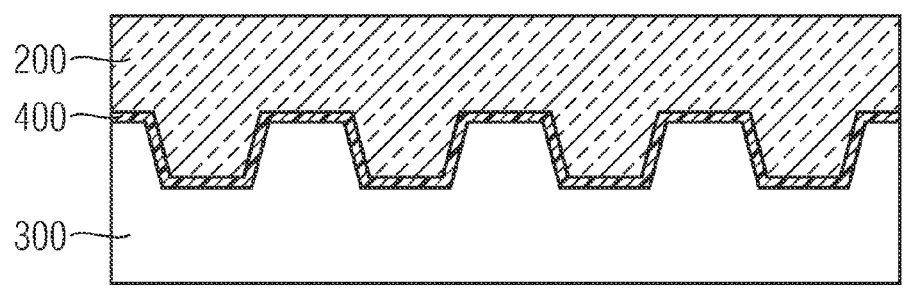
FIG. 2B is a schematic cross-sectional view of a wafer assembly emerging from the method as illustrated in FIG. 2A.

FIGS. 2A to 2B refer to an embodiment with a pre-patterned glass piece 200 provided with one or more protrusions 202 matching with one or more cavities 302 in the semiconductor substrate 300.

The pre-patterned glass piece 200 may be formed from a photosensitive glass using for instance a lithium-aluminum silicated glasses with small amounts of cerium and silver. Photosensitive glasses provide small slopes and etching depths up to 2.5 mm. According to another embodiment, the pre-patterned glass 200 is provided from a photo-defining glass wherein during a bake process areas previously exposed to light are transformed into a phase having an etch rate that differs from the etch rate in the unexposed areas. By way of example, the exposed regions may be transformed into a ceramic material. Further, the pre-patterned glass 200 may be patterned by glass etching processes, mechanical processes like grinding or milling, laser ablation or by glass pressing techniques using appropriate molds. According to another embodiment the pre-patterned glass 200 is provided by glass pressing using a single-crystalline material, for example single-crystalline silicon.

An adhesive material 400a is applied between the semiconductor substrate 300 and the glass piece 200 before the glass piece 200 and the semiconductor substrate 300 are brought into contact with each other. The adhesive material 400a may be provided on a working surface 301 of the semiconductor substrate 300 or a working surface 201 of the glass piece 200 or on both. The adhesive material 400a may be applied to a complete working surface 301, 201 or may be applied only to sections of the respective working surface 301, 201, for example in the bottom of the cavity 302 or outside the cavity 302. Then the glass piece 200 and the semiconductor substrate 300 are brought in contact with each other and the adhesive material 400a is cured.

As shown in FIG. 2B, after curing the adhesive material 400a forms an adhesive layer 400 between the semiconductor substrate 300 and the glass piece 200. Adhesive layers 400 on the basis of polyimide or other organic compounds may improve temperature stability of the composite formed by the glass piece 200 and the semiconductor substrate 300.

Figure 2C:
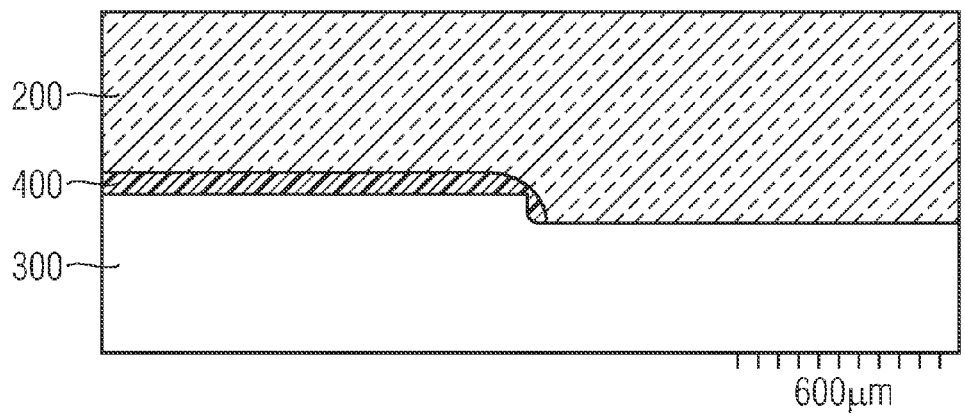
FIG. 2C is a cross-sectional view of a wafer assembly emerging from the method illustrated with FIG. 2A.

FIG. 2C shows a cross-section of a wafer assembly emerging from the method described with reference to FIGS. 2A and 2B. An adhesive layer 400 is formed outside the cavity 302 between the glass piece 200 and the semiconductor substrate 300.

Figure 3A:
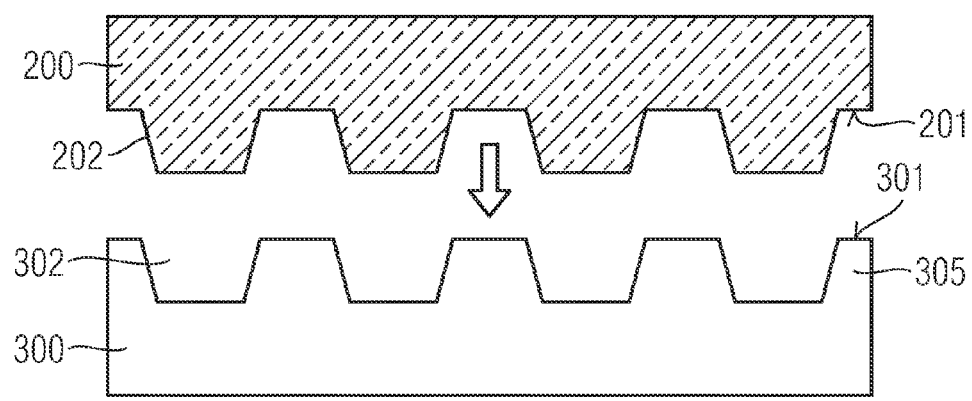
FIG. 3A is a schematic cross-sectional view of an arrangement including a pre-patterned glass piece and a single-crystalline semiconductor device for illustrating a method of manufacturing a wafer assembly according to an embodiment using a pre-patterned glass piece and in-situ bonding.
Figure 3B:
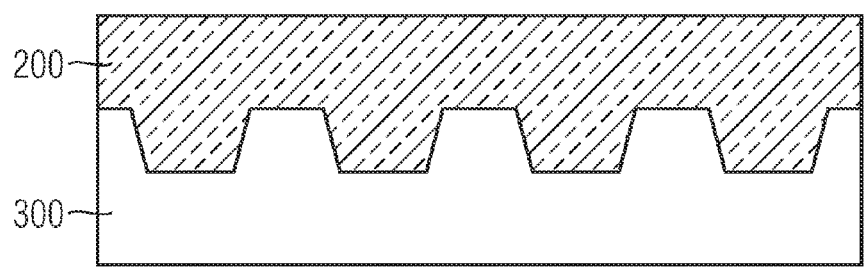
FIG. 3B is a schematic cross-sectional view of a wafer assembly emerging from the method as illustrated in FIG. 3A.

According to the embodiment shown in FIGS. 3A and 3B, a glass piece 200 having one or more protrusions 202 formed on a working surface 201 is in-situ bonded to a single-crystalline semiconductor substrate 300. The glass piece 200 is arranged such that the protrusions 202 fit into the cavities 302 of the semiconductor substrate 300. Then the glass piece 200 and the semiconductor substrate 300 are pressed against each other, wherein a temperature of the glass piece 200 is controlled such that the glass material fluidifies for a period of time and the temperature and a force exerted on the glass piece 200 are controlled such that fluidified glass material re-solidifies and the re-solidified glass material is bonded to the semiconductor substrate 300.

The slope angle of the insulating structure may be tuned to obtain a desired potential gradient along the insulating structure, for example the potential gradient along an insulating edge termination structure of a semiconductor device. Since a coated material tends to be spun out from wide cavities, conventional spin coating methods do not fill wide cavities exceeding a width of several micrometers reliably. Instead, for semiconductor substrates the present embodiment provides a fast and reliable method for filling wide trenches having a width of 5 micrometers and more with insulating materials.

The method further allows insulating structures having different slope angles, different depths and different widths to be filled in one single step.

For example, the semiconductor substrate 300 may have a pattern with cavities 302 formed in the working surface 301, wherein two of the cavities 302 have slope angles which differ from each other by at least 30 degree, or depths which differ from each other by at least 20% of the shallower one. A glass piece 200 is provided that comprises a pattern with protrusions 202 on the working surface 201 of the glass piece 200, wherein the protrusions 202 match with the pattern the cavities 302 formed in the working surface 301 of the semiconductor substrate 300.

Figure 4A:
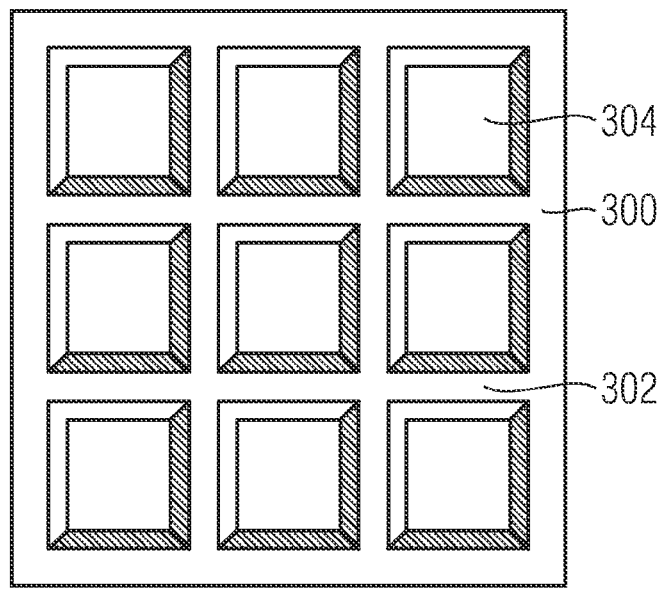
FIG. 4A is a schematic plan-view of a portion of a semiconductor substrate including a grid-like cavity formed in a working surface for illustrating a further embodiment.

FIG. 4A shows a portion of a semiconductor substrate 300 where a cavity 302 forms a grid in the working surface 301 of the semiconductor substrate 300. The grid extends along kerf areas provided for separating semiconductor dies formed from the same semiconductor substrate 300.

Figure 4B:
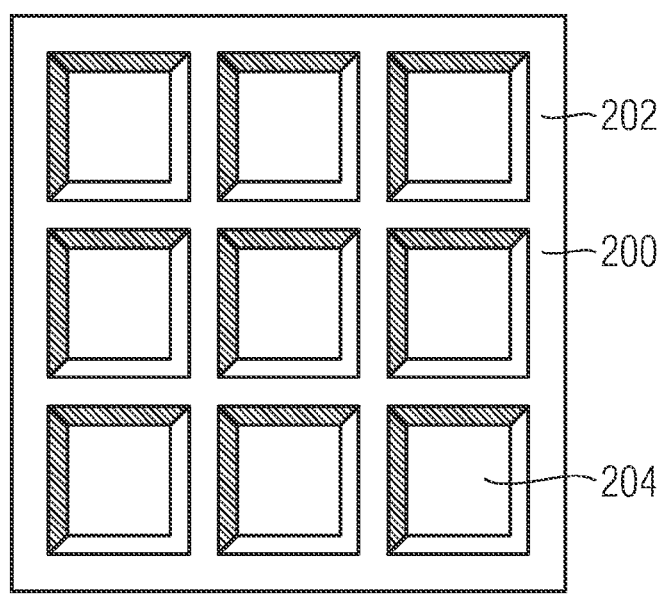
FIG. 4B is a schematic plan view of a section of a glass piece with a grid-like protrusion matching with the grid-like cavity of the semiconductor substrate of FIG. 4A.

FIG. 4B shows a glass piece 200 with a protrusion 202 forming a grid which matches with the grid formed by the cavity 302 in the semiconductor substrate 300.

After the glass piece 200 of FIG. 4B and the semiconductor substrate 300 of FIG. 4A have been bonded using one of the methods as described with reference to FIGS. 2A, 2B or FIG. 3A, 3B, the composite formed from the glass piece 200 and the semiconductor substrate 300 is sawed or ripped along the kerf areas to obtain separated semiconductor dies from the meshes of the grid.

The composite formed from the glass piece 200 bonded to the semiconductor substrate 300 exhibits high mechanical stability, since the solid glass material provides a reliable mechanical support. Excess material of the glass piece 200 can be removed using mechanical or chemical methods. An adhesive layer may be used to improve temperature stability of the composite and to allow high temperature processes being performed on the composite. Other than thick polymer structures, thin adhesive layers and inorganic glasses can be more easily cut or sawn during a separating process.

FIGS. 5A to 5H refer to an embodiment using a glass piece 200 for stabilizing a semiconductor substrate 300 during and/or after a thinning process. In addition the glass piece provides an insulating edge termination for semiconductor dies.

Figure 5A:
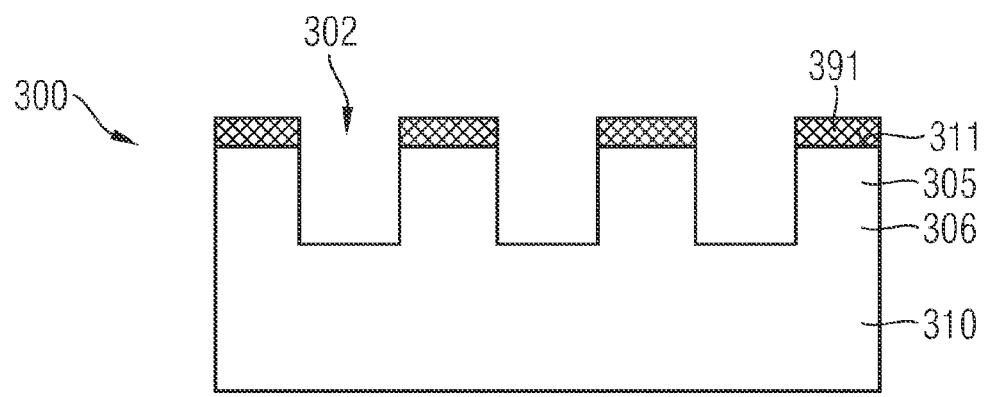
FIG. 5A shows a schematic cross-sectional view of a semiconductor substrate including cavities for illustrating a method of manufacturing a semiconductor device in accordance with an embodiment referring to the thinning of semiconductor substrates.

FIG. 5A shows a semiconductor substrate 300, which may be a pre-processed single-crystalline semiconductor substrate 300, for example a single-crystalline silicon wafer or a silicon-on-insulator wafer. The semiconductor substrate 300 may comprise further doped and undoped sections or epitaxial semiconductor layers and insulating structures. In the following, it is referred to as semiconductor substrate 300 regardless of the presence of any non-semiconducting portions.

The semiconductor substrate 300 comprises a semiconductor base 310 with semiconductor portions 306, in which semiconductor elements 305, for example diodes, transistors, field effect transistors, IGBTs (insulated gate bipolar transistors), etc. are formed. The semiconductor base 310 may contain shallow isolation structures separating semiconductor elements formed in the semiconductor base 310. On a front side surface 311 of the semiconductor base 310, a front side metallization 391 may be provided. The front side metallization 391 may be patterned to form sections which are assigned to different electric signals and which are separated by insulating structures. The front side metallization 391 may include one metallization layer or two or more metallization layers separated by interlayer dielectrics. The front side metallization 391 may include wiring lines and contact structures made of aluminum Al, copper Cu or other metals or metal alloys and may comprise diffusion barrier layers which are suitable for blocking the diffusion of aluminum or copper into the semiconductor base 310.

A passivation layer may be provided that may be effective as hard mask for forming cavities 302 between sections of the front side metallization 391. The cavities 302 extend into the semiconductor base 310. The cavities 302 may be hole trenches with approximately rectangular or circular-shaped openings. According to an embodiment, the cavities 302 form elongated grooves. According to another embodiment one cavity 302 may form a grid separating the semiconductor portions 306 of the semiconductor base 310 assigned to single semiconductor dies of the wafer composite formed by the semiconductor substrate 300. The grid may be a regular, orthogonal grid. For example, the grid extends along a kerf grid provided for separating the semiconductor dies.

The width of the cavity 302 forming the grid can be wider than the width of the kerf area, wherein the width of the kerf can be some 10 micrometers up to some 100 micrometers depending on further tasks the kerf has to fulfill. The depth of the cavity 302 may vary from some 10 micrometers up to several 100 micrometers. For example, the cavity 302 has a width of 30 micrometers and a depth of 150 micrometers. The hard mask material may be, for example, TEOS (tetraethylorthosilane).

One or more auxiliary layers may be deposited that may line the cavities 302. For example, an electric passivation layer 322 may be deposited that is configured to electrically passivate the semiconductor base 310. A second auxiliary layer 324 for moisture passivation may be deposited on the first auxiliary layer 322. A third auxiliary layer 326 may be provided for gettering or as an adhesive layer or both. The auxiliary layers may be conformally deposited to form layers lining the pattern on the semiconductor substrate 300 with equal thickness, respectively.

Figure 5B:
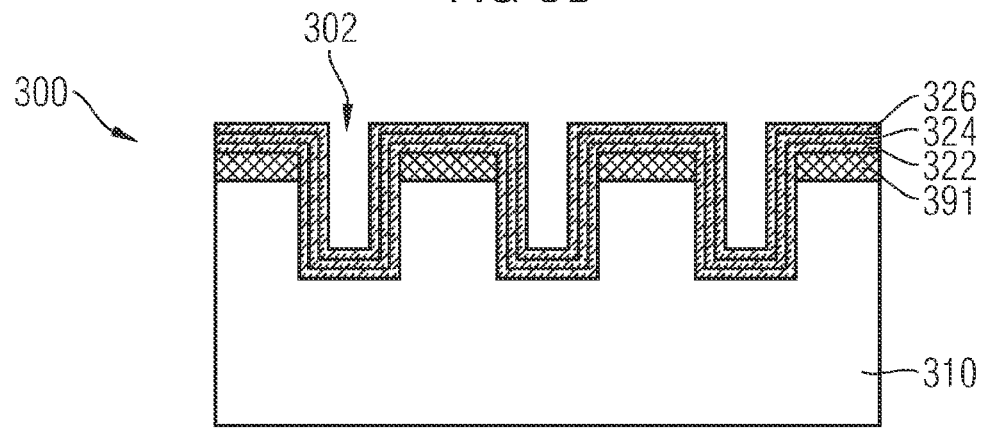
FIG. 5B is a schematic cross-sectional view of the semiconductor substrate of FIG. 5A after depositing auxiliary layers.

FIG. 5B shows the first auxiliary layer 322 and the second auxiliary layer 324 lining the surface of the semiconductor substrate 300 with the cavities 302. The first auxiliary layer 322 may be a DLC (diamond-like carbon) layer having a thickness of several 10 nm. The second auxiliary layer 324 may be a silicon nitride layer having a thickness of several 10 nm. The third auxiliary layer 326 may be a BPSG layer having a thickness of several 10 nm. Examples for auxiliary layers are doped and undoped silicon oxides, silicon nitride, carbon layers, diamond-like carbon layers, metal layers, high-k and low-k dielectrics.

A glass piece 200, for example a pre-patterned glass piece 200 with protrusions 202 fitting into the cavities 302, is bonded to the semiconductor substrate 300. According to an embodiment, the glass piece 200 is adhesive bonded on an auxiliary layer 326 effective as an adhesive layer, for example a BPSG layer. According to another embodiment, the glass piece 200 is in-situ bonded to the semiconductor substrate 300 without an adhesive layer, for example on the second auxiliary layer 324, by using a glass pressing technique. The pre-patterned glass piece 200 may be provided from photosensitive glass such that by using masked irradiation of the glass piece 200, the glass is directly patterned from the front side by using different etch rates of exposed and unexposed sections of the glass piece 200. According to another embodiment, a polysilicon layer may be used as a hard mask for patterning the glass piece 200 from the front side. According to yet another embodiment, the glass piece 200 is formed from a powder, glass frits or glass pellets or a flat glass disk, wherein the glass material is fluidized and a fluidified glass material flows into the cavities 302.

Figure 5C:
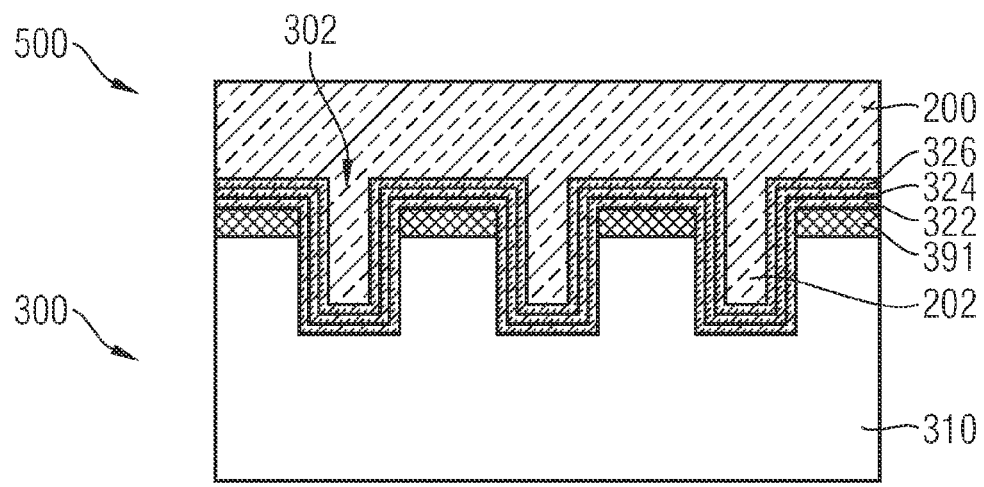
FIG. 5C is a schematic cross-sectional view of a wafer arrangement with the semiconductor substrate of FIG. 5B bonded with a pre-patterned glass piece.

FIG. 5C shows a wafer assembly 500 comprising the semiconductor substrate 300 and the glass piece 200 bonded to the semiconductor substrate 300. The cavity 302 formed in the semiconductor substrate 300 is filled with a protrusion 202 of the glass piece 200. An adhesive layer 326 may be arranged between the semiconductor substrate 300 and the glass piece 200, wherein the adhesive layer 326 adhesively bonds the glass piece 200 to the semiconductor substrate 300. The glass piece 200 stabilizes the wafer assembly during the following processes. An additional carrier or support structures for stabilization are not required.

In the wafer assembly 500, the semiconductor substrate 300 may be thinned from a rear side which is opposite to a front side defined by the front side surface 311. During the thinning process, the glass piece 200 mechanically stabilizes the semiconductor substrate 300. A buried edge of the first auxiliary layer 322, the second auxiliary layer 324, the third auxiliary layer 326 or the glass piece 200 may provide an etch stop signal for stopping the thinning process, which may be a CMP (chemical-mechanical polishing), mechanical grinding, dry etch or wet etch process, by way of example. This results in a well-defined thickness of the semiconductor substrate 300 after performing the thinning process. The thinning process may stop on the buried edge of the glass piece 200 or any of the auxiliary layers. According to other embodiments the thinning may proceed beyond the buried edge of the glass piece 200 and may end at a predefined distance to the front side surface 311. According to a further embodiment the thinning process stops within the semiconductor substrate 300 before reaching any of the auxiliary layers or the glass piece 200.

Figure 5D:
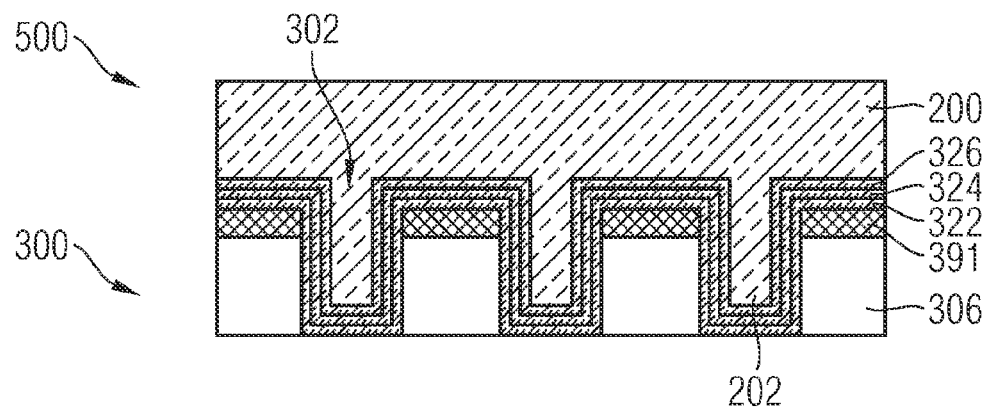
FIG. 5D is a schematic cross-sectional view of the wafer assembly of FIG. 5C after thinning.

FIG. 5D shows the thinned wafer assembly 500 with the first auxiliary layer 322 being exposed by the thinning process. In the case the cavity 302 forms a grid, the thinning separates semiconductor dies formed in the semiconductor substrate 300 from each other, wherein each semiconductor die is embedded in one mesh of the grid formed by the protrusions 202 of the glass piece 200. In this way, the glass piece 200 replaces a carrier construction supporting the semiconductor substrate 300 during and after thinning. A light shielding layer 335 may be deposited on the rear side of the wafer arrangement 500.

Figure 5E:
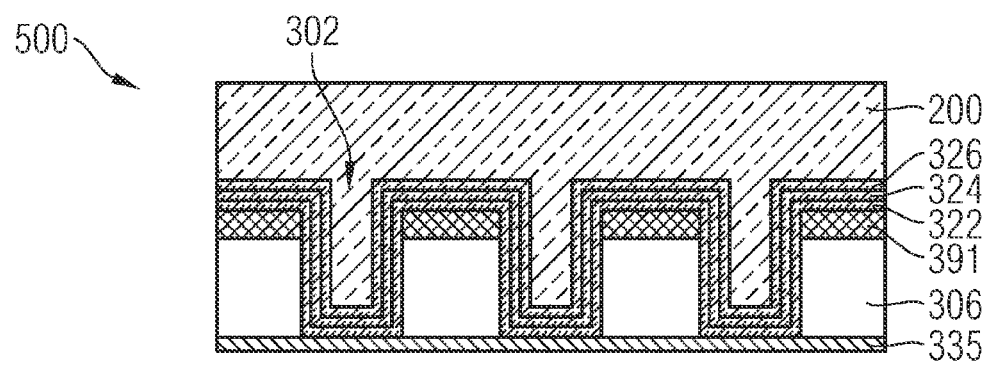
FIG. 5E is a schematic cross-sectional view of the wafer assembly of FIG. 5D after providing a light shielding layer.

FIG. 5E shows the light shielding layer 335 on the rear side of the thinned semiconductor base 310. According to an embodiment, the light shielding layer 335 is made of amorphous silicon (a-Si) and has a thickness of up to several nanometers. In sections where the light shielding layer 335 is in contact with the semiconductor base 310 laser light irradiating on the light shielding layer 335 during an LTA (laser thermal anneal) process converts the amorphous silicon into the crystalline phase. Remnant portions 336 outside the semiconductor base 310 block laser light impinging from the rear side from irradiating into the glass piece 200 or on the adhesive layer 326.

According to an embodiment, an implant is performed on the rear side of the wafer arrangement 500. For example, hydrogen atoms (protons) are implanted to form a field stop layer of an IGBT. After the implant the wafer assembly 500 is heated up to about 400° C. to anneal the implant damages. The anneal temperature is below the temperature at which the bonding between the glass piece 200 and the semiconductor substrate 300 breaks up. Furthermore, a p-doped emitter for IGBTs, an highly n-doped emitter for diodes or a highly n-doped drain region for power MOSFETs may be realized on the rear side by an ion implantation step with a subsequent laser thermal annealing step, wherein the p-doped IGBT emitter can be activated by a low-temperature anneal at temperatures between 300° C. and 400° C. No further support is required for stabilizing the wafer assembly 500.

On the front side, the glass piece 200 may be thinned, for example by an etch process or by chemical mechanical polishing, mechanical grinding, dry etch or wet etch. Openings 212 may be formed in the glass piece 200 to expose contact pads of the front side metallization 391 for test, and measurement and contacting.

Figure 5F:
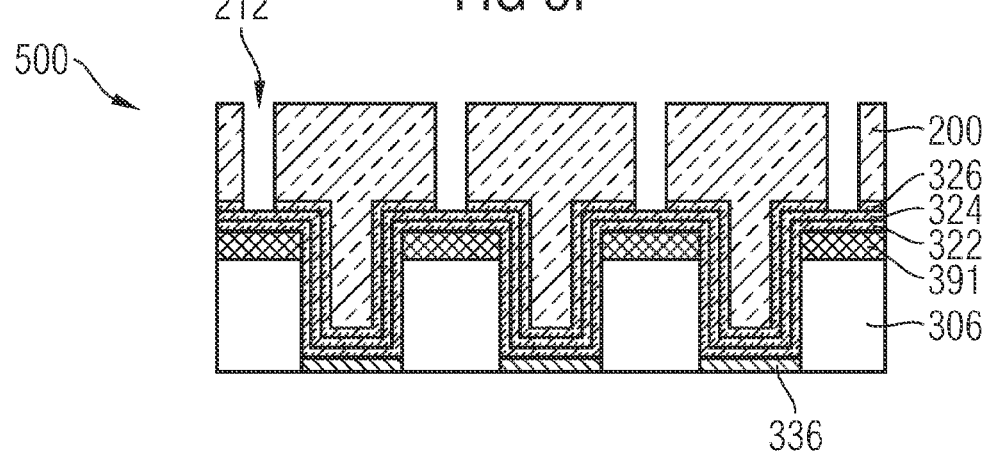
FIG. 5F is a schematic cross-sectional view of the wafer assembly of FIG. 5E after providing openings in the glass piece.

FIG. 5F shows the openings 212 in the glass piece 200, which may have a circular or a rectangular shaped cross-section and which expose contact pads of the front side metallization 391. On the rear side of the wafer assembly 500, remnant portions 336 of the light shielding layer 335 block light impinging at the rear side from entering into the glass piece 200.

Figure 5G:
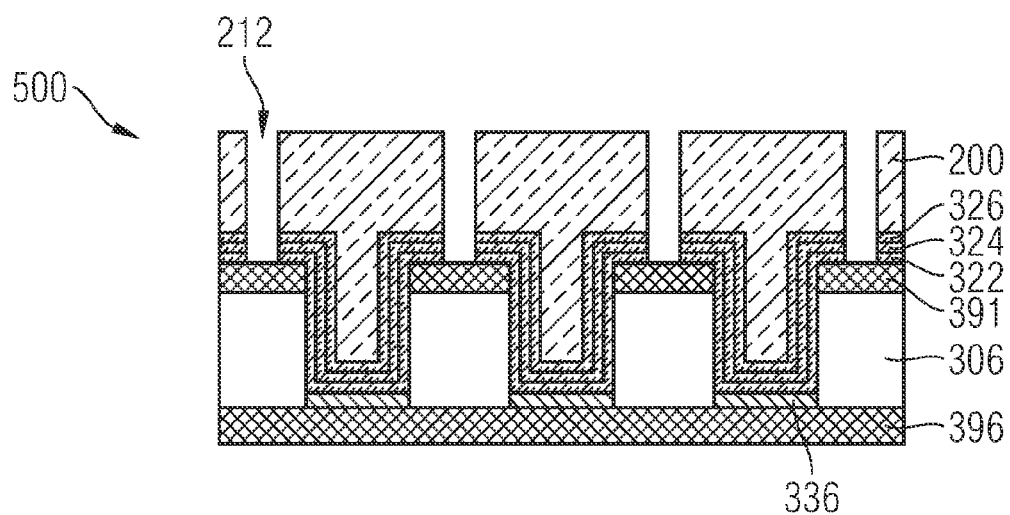
FIG. 5G is a schematic cross-sectional view of the wafer assembly of FIG. 5F after providing conductive material on a rear side.

The auxiliary layers are etched through in sections exposed by the openings 212 in the glass piece 200 as shown in FIG. 5G. A rear side metallization 396 may be provided on the rear side.

Figure 5H:
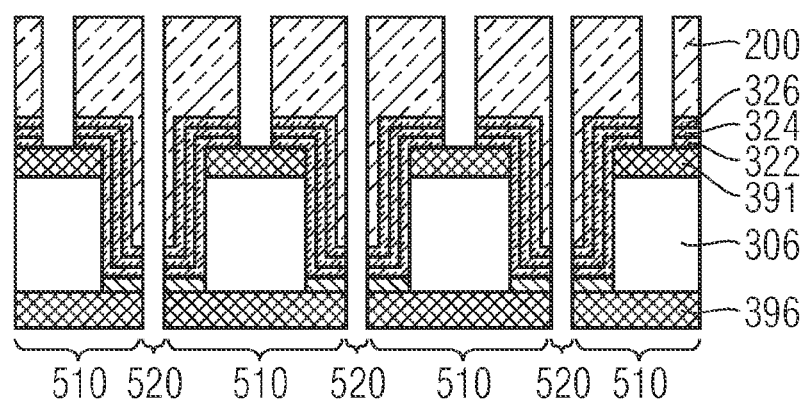
FIG. 5H is a simplified cross-sectional view for illustrating semiconductor dies obtained from the wafer assembly of FIG. 5G according to an embodiment providing sawing of the wafer arrangement.

Then the wafer assembly 500 is ripped or sawed in the kerf areas 520 as shown in FIG. 5H to separate semiconductor dies 510 of the wafer assembly 500. The sawing can be performed mainly in glass. During sawing, the glass protects the semiconductor portion 306. Each sawn, separated semiconductor die 510 has a glass frame which completely encompasses the semiconductor portion 306 of the semiconductor die 510 at the edge surface and which covers the front side metallization 391. More specifically, the glass piece 200 forms a glass cap which together with the rear side metallization 396 enwraps the semiconductor portion 306 of each semiconductor die 510.

The semiconductor die 510 comprises one or more semiconductor elements formed in a single-crystalline semiconductor portion 306, wherein the semiconductor portion 306 has a working surface, a rear side surface opposite to the working surface and an edge surface connecting the working and rear side surfaces. The semiconductor die 510 further comprises a glass frame that is bonded to the single-crystalline semiconductor portion 306. The glass frame consists of or comprises a portion extending from the working surface into the semiconductor portion 306 or along the edge surface of the semiconductor portion 306. The glass frame may extend from the working surface to the rear side metallization 396. The semiconductor portion 306 may be in-situ bonded to the glass frame. According to an embodiment, an adhesive layer 400 may be provided between the semiconductor portion 306 and the glass frame, wherein the adhesive layer 400 adhesive bonds the glass frame and the semiconductor portion 306. Auxiliary layers, for example a DLC layer, a silicon nitride layer and/or a BPSG layer may be provided between the glass frame and the semiconductor portion 306.

The glass piece 200 may form a contiguous frame extending along the edge surface of the semiconductor portion 306. According to another embodiment, the glass piece 200 forms a cap which together with a rear side metallization 396 enwraps the semiconductor portion 306.

The embodiment of FIGS. 6A to 6I refers to a semiconductor substrate 300 including a semiconductor base 310. The semiconductor substrate 300 may be a preprocessed silicon wafer wherein in device portions 312 complete or parts of semiconductor elements are formed, for example diodes, transistors, field effect transistors, IGBTs. According to an embodiment, in the device portions 312 front side components of an IGBT are formed. A hard mask material 380 is provided on a front side surface 301 of the semiconductor base 310. For example, the hard mask layer 380 may be a TEOS layer having a thickness of several 10 μm. The hard mask layer 380 is opened along the kerf areas and a cavity 302 is formed in the kerf area. According to an embodiment, the cavity 302 forms a grid, wherein the width of the cavity 302 is wider than a width of the kerf area which is consumed in a sawing or ripping process. The cavity 302 may be formed using a mechanical process, plasma-enhanced or wet chemical etching as well as laser ablation, providing vertical sidewalls. According to an embodiment an anisotropic wet etching providing sloped sidewalls is performed to adjust a field gradient at the device edge by the slope angle of an insulating edge termination structure.

The hard mask layer 380 is removed and one, two, three or more auxiliary layers are successively deposited in a conformal manner on the working surface 301 of the semiconductor substrate 300.

Figure 6A:
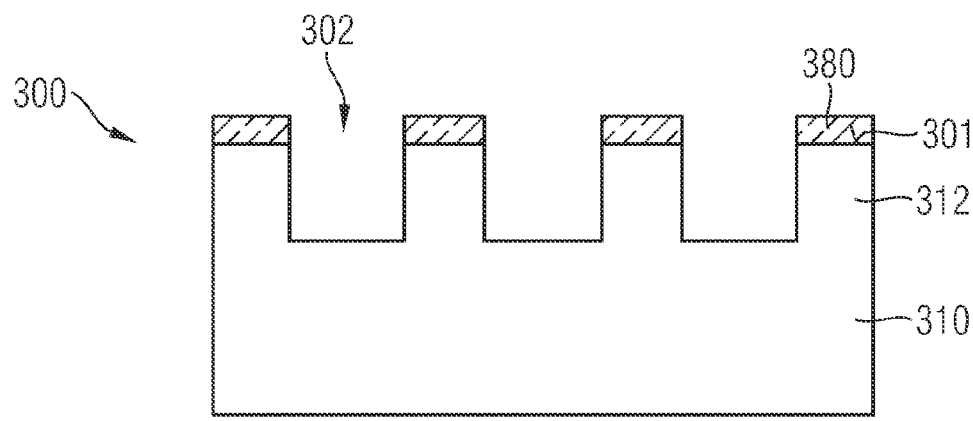
FIG. 6A is a schematic cross-sectional view of a semiconductor substrate including cavities for illustrating a further embodiment referring to the manufacture of semiconductor devices including a thinning of the semiconductor substrate.
Figure 6B:
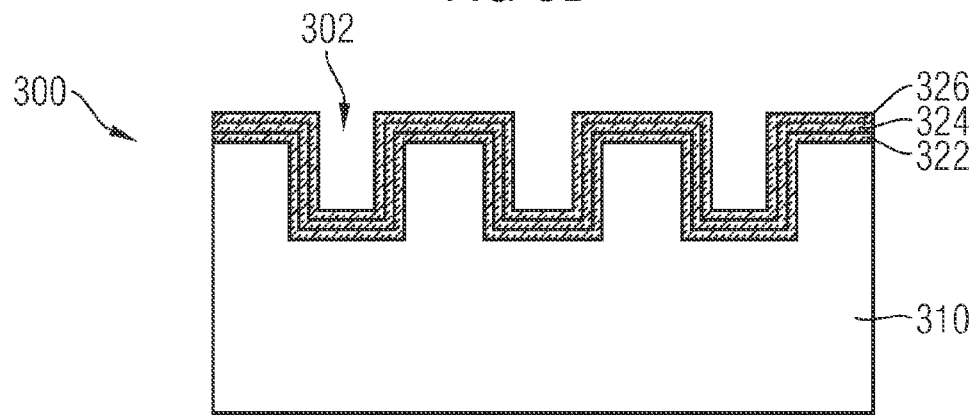
FIG. 6B is a cross-sectional view of the semiconductor substrate of FIG. 6A after depositing auxiliary layers.

FIG. 6B shows a first auxiliary layer 322, a second auxiliary layer 324 and a third auxiliary layer 326 lining the working surface 301 including the cavities 302 in a conformal manner. Other embodiments may provide only one, two or more than three auxiliary layers.

A glass piece 200 is bonded to the semiconductor substrate 300 to form a wafer assembly 500. According to an embodiment, the glass piece 200 is formed by glass pressing from a glass powder, glass frits, glass pellets or from a flat glass disk by fluidifying the glass material such that the fluidified glass material fills the cavities 302. According to another embodiment, a pre-patterned glass piece 200 having protrusions 202 fitting into the cavities 302 is bonded to the semiconductor substrate 300, for example by in-situ bonding or by adhesive bonding using the upmost auxiliary layer as an adhesive layer.

Figure 6C:
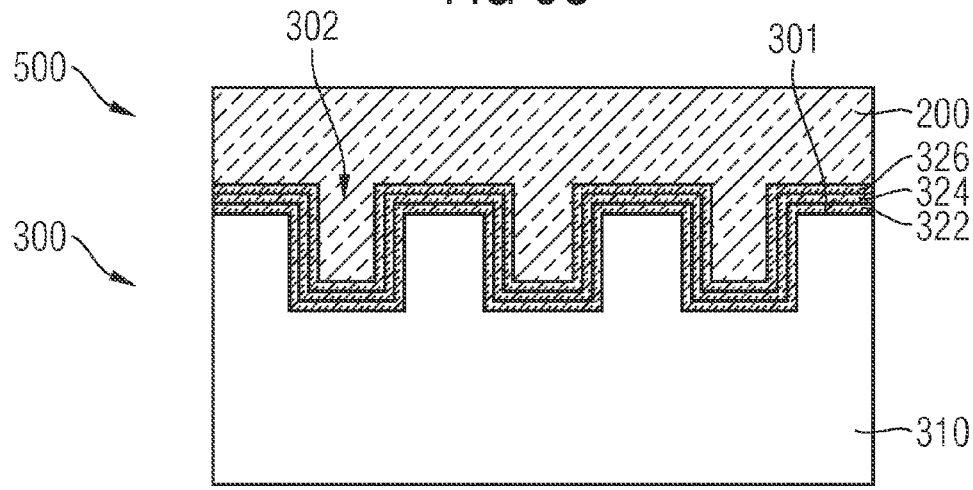
FIG. 6C is a schematic cross-sectional view of a wafer assembly comprising the semiconductor substrate of FIG. 6B and a glass piece bonded to the semiconductor substrate.

FIG. 6C shows the wafer assembly 500 with the glass piece 200 bonded to the semiconductor substrate 300, wherein a first, a second and a third auxiliary layer 322, 324, 326 line a pattern in the working surface 301 of the semiconductor base 310. Excess portions of the glass piece 200 outside the cavities 302 may be removed using glass polishing or chemical-mechanical polishing (CMP) method. Sections of the auxiliary layers 322, 324, 326 outside the cavities 302 are removed using wet chemical or plasma etch methods or mechanical grinding. For example BPSG and glass may be removed by wet etching, and silicon nitride and DLC layers may be removed by a plasma etch method. Alternatively, a glass or oxide CMP may be performed.

Figure 6D:
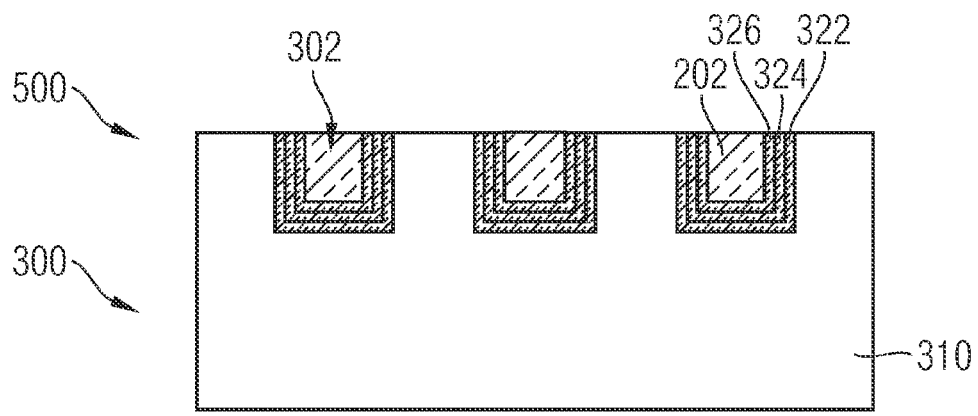
FIG. 6D is a schematic cross-sectional view of the wafer assembly of FIG. 6C after removing excess portions of the glass piece outside the cavities.

FIG. 6D shows the wafer assembly 500 comprising the semiconductor substrate 300 and the protrusions 202 of the glass piece 200 filling the cavities 302 in the semiconductor substrate 300.

A light shielding layer is deposited to cover the glass protrusions 202. For example, a cold amorphous silicon layer (a-Si) is deposited and patterned, such that remnant portions 331 of the light shielding layer are formed on non-semiconductor surfaces, for example on the exposed edges of the auxiliary layers 322, 324, 326 and on the protrusions 202. The wafer assembly 500 may be tempered in a hydrogen/nitrogen H2/N2 atmosphere to saturate hydrogen bonds.

Figure 6E:
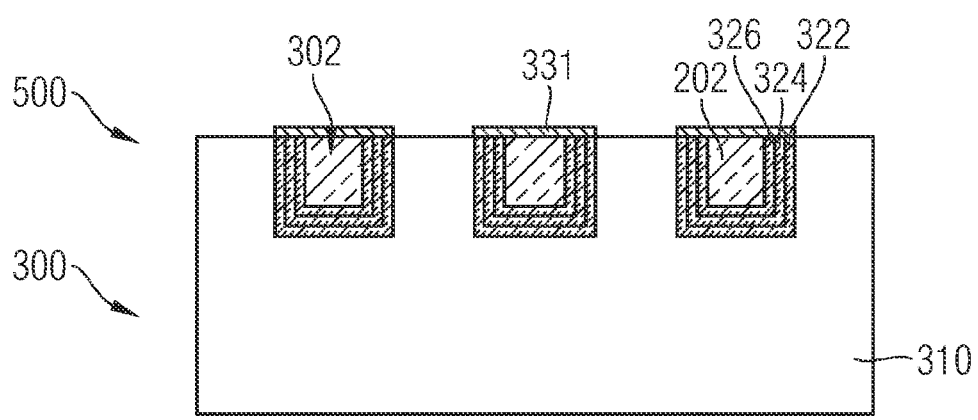
FIG. 6E is a schematic cross-sectional view of the wafer assembly of FIG. 6D after providing a light shielding layer.

FIG. 6E shows the wafer assembly 500 with remnant portions 331 of a light shielding layer covering exposed edges of the auxiliary layers 322, 324, 326 and the protrusions 202.

Then a front side metallization 391 may be provided, wherein contacts and wiring lines are formed from a metal, for example aluminum Al or copper Cu using suitable diffusion barrier layers. Isolation structures may insulate separate metal wires and contacts. The front side metallization 391 may comprise one, two or more metallization layers wherein the metallization layers are separated by interlayer dielectrics.

Figure 6F:
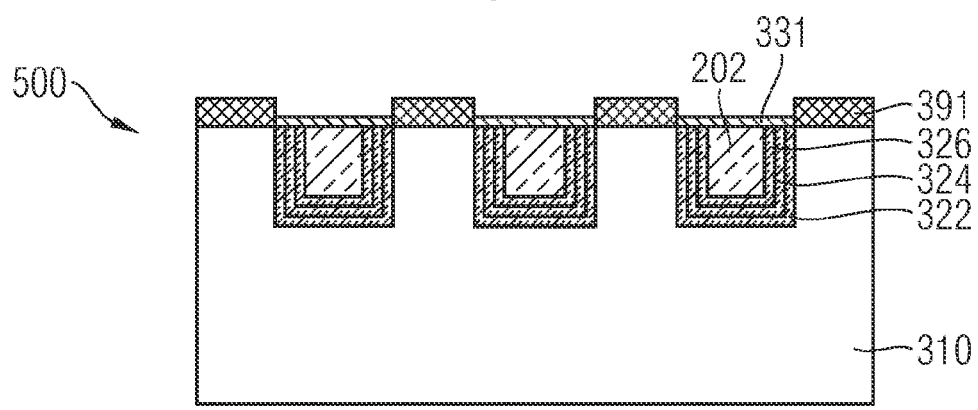
FIG. 6F is a schematic cross-sectional view of the wafer assembly of FIG. 6E after providing conductive structures on a front side.

FIG. 6F shows schematically the front side metallization 391 provided for the semiconductor devices formed between the protrusions 202.

An adhesive material 360 may be applied to the front side of the semiconductor substrate 300 and a carrier 370 is adhesive bonded to form a wafer/carrier assembly 502. According to an embodiment the carrier 370 may be a glass carrier. The carrier 370 may mechanically support the wafer assembly 500 during a thinning of the semiconductor base 310 from the rear side. According to an embodiment, a support structure is not used. The buried edge of one of the auxiliary layers 322, 324, 326 or the glass protrusions 202 may be used as an etch stop signal indicating a stop of the thinning process. According to other embodiments, the thinning process does not necessarily need to stop on the auxiliary layers 322, 324, 326. For example, the thinning process may stop on the buried edge of the glass protrusions 202. According to other embodiments the thinning may proceed beyond the buried edge of the glass protrusions 202 and may end at a predefined distance to the front side metallization 391 or working surface 301. According to a further embodiment the thinning process stops within the semiconductor substrate 300 before reaching any of the auxiliary layers 322, 324, 326 or the glass protrusions 202.

Figure 6G:
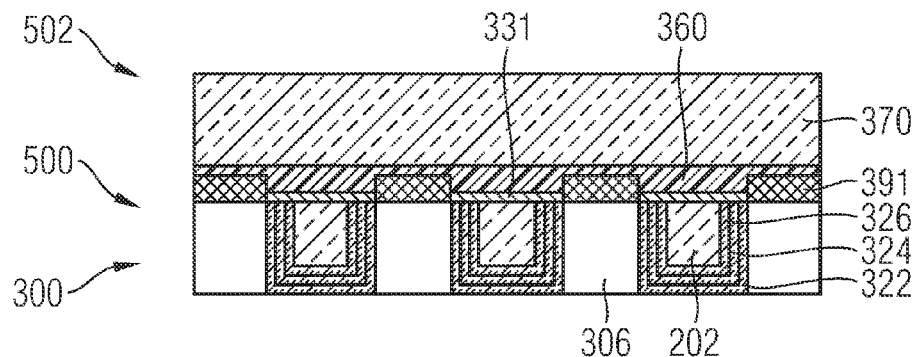
FIG. 6G is a schematic cross-sectional view of the wafer assembly of FIG. 6F after providing a carrier on the front side and performing the thinning step on the backside.

FIG. 6G shows the wafer/carrier assembly 502 with the thinned semiconductor substrate 300 exposing the lower edge of the first auxiliary layer 322. An implant may be performed at the rear side to form a field stop layer. Then, the wafer/carrier assembly 502 may be heated up to a temperature of about 400 degree Celsius to anneal implant damages.

Furthermore, a p-doped emitter for IGBTs, an highly n-doped emitter for diodes or a highly n-doped drain region for power MOSFETs may be realized on the rear side by an ion implantation step with a subsequent LTA (laser thermal annealing) step, wherein the p-doped IGBT emitter can be activated by a low-temperature anneal at temperatures between 300° C. and 400° C. The carrier 370 may be removed. During the LTA process the remnant portions 331 of the light shielding layer are effective as a laser barrier and protect the adhesive material of the adhesive layer 360 to be evaporated. The wafer assembly 500 comprising the semiconductor substrate 300 and the glass protrusions 202 is mechanically stable during the anneal. A rear side metallization 396 may be provided on the rear side of the semiconductor substrate 300.

Figure 6H:
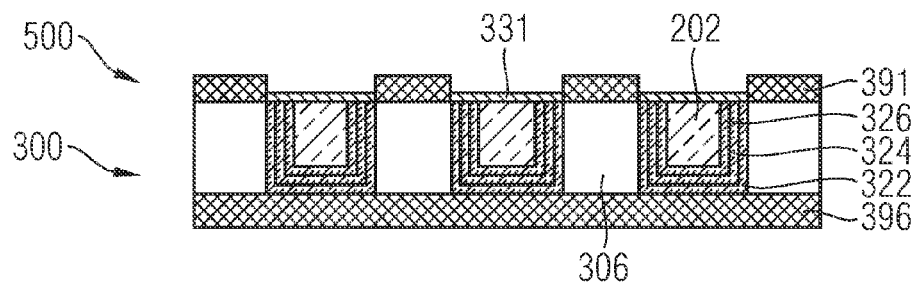
FIG. 6H is a schematic cross-sectional view of the wafer assembly of FIG. 6G after providing conductive structures on a rear side and removing the carrier.

FIG. 6H shows the wafer assembly 500 comprising the semiconductor substrate 300 including a rear side metallization 396 and the glass protrusions 202 as remnants of the glass piece 200.

Figure 6I:
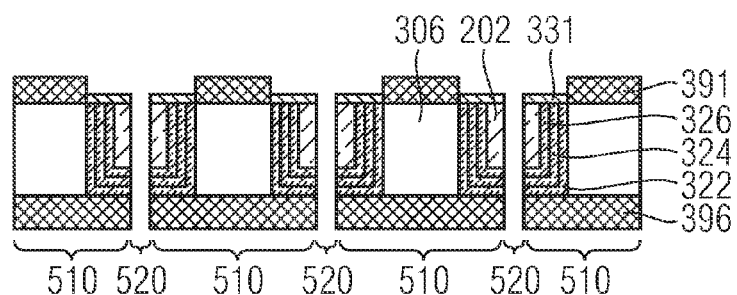
FIG. 6I is a schematic cross-sectional view for illustrating semiconductor dies obtained from the wafer arrangement of FIG. 6H by sawing.

As shown in FIG. 6I, the wafer assembly 500 is sawn or ripped along the kerf areas 520 to separate the semiconductor dies 510. Each semiconductor die 510 may comprise a glass frame that may completely or partially surround or enclose the semiconductor portion 306 of the semiconductor die 510. The glass frame includes one or more auxiliary layers 322, 324, 326. Edges of the auxiliary layers 322, 324, 326 are exposed between the glass protrusions 202 and the rear side metallization 396, respectively.

Figure 7:
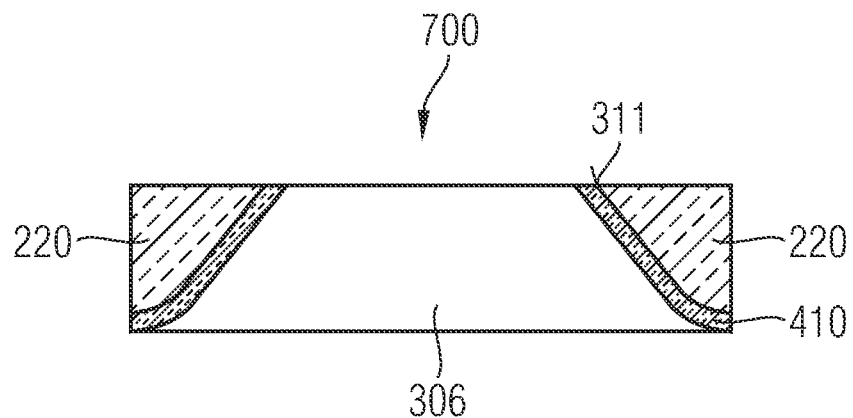
FIG. 7 is a schematic cross-sectional view of a semiconductor device according to another embodiment.

FIG. 7 shows a semiconductor device 700 with a glass frame 220 bonded to a semiconductor portion 306. The glass frame 220 may have a slope of a variable angle, for example in the range between 30 and 80 degrees with regard to a front side surface 311 and adjusts a potential gradient in an edge region of the semiconductor portion 306. The glass frame 220 completely encloses the semiconductor portion 306. Between the glass frame 220 and the semiconductor portion 306 one or more auxiliary layers may be formed, for example a BPSG layer 410.

Figure 8:
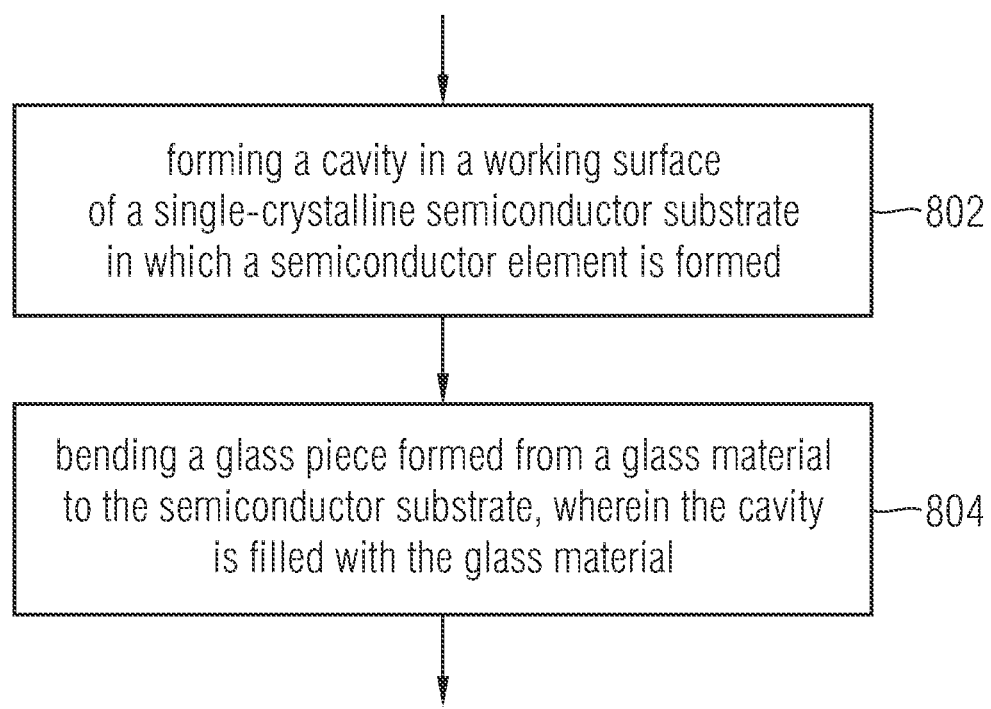
FIG. 8 is schematic flowchart of a method of manufacturing a semiconductor device in accordance with an embodiment.

According to an embodiment of a method of manufacturing a semiconductor device as illustrated in FIG. 8, a cavity is formed in a working surface of a single-crystalline semiconductor substrate, in which a semiconductor element is formed (Step 802). A glass piece formed from a glass material is bonded to the single-crystalline semiconductor substrate, wherein the cavity is filled with the glass material (Step 804).

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a power semiconductor device, comprising:
    forming a cavity in a working surface of a substrate in which a power field effect transistor is formed, wherein the cavity forms a grid extending along kerf areas of the substrate, wherein the cavity is wider than the kerf area;
    bonding a glass piece formed from a glass material to the substrate, wherein the cavity is at least partly filled with the glass material, the glass material is a powder, glass frits, includes pellets or is a glass disk, and the bonding comprises:
    arranging the glass material in contact with the working surface of the substrate;
    pressing the glass material and the substrate against each other, wherein a temperature of the glass material and a force exerted on the glass material are controlled such that fluidified glass material flows into the cavity;
    controlling the temperature and the force to re-solidify the fluidified glass material, the re-solidified glass material forming the glass piece with a protrusion extending into the cavity, wherein the glass piece is in-situ bonded to the substrate;
    separating, after the bonding, the substrate along the kerf areas to obtain a plurality of semiconductor dies from the substrate, each semiconductor die including a glass frame or glass cap emerging from the glass piece; and
    thinning, after the bonding and before the separating, the substrate from a rear side which is opposite to a front side defined by the working surface.

2. The method according to claim 1, wherein the glass material exhibits a glass transition and the glass material fluidifies when the temperature of the glass material exceeds a glass transition temperature.

3. The method according to claim 1, wherein the glass material is an inorganic glass selected from the group consisting of soda-lime glass, undoped silica glass, and silica glass doped with at least one dopant, the dopant(s) being selected from a group containing boron, sodium, calcium, potassium and aluminum, a photostructurable glass, and a polymer selected from a group containing polynorbornene, polystyrene, polycarbonate, polyimide, and benzocyclobutene.

4. The method according to claim 1, further comprising removing excess portions of the glass piece outside the cavity using an etch process that removes the glass material selectively against the substrate.

5. The method of claim 1, wherein the glass piece is adhesive bonded to the substrate through an adhesive material provided between the substrate and the glass piece before the bonding.

6. The method according to claim 1, wherein the glass piece is in-situ bonded to the substrate by pressing the glass piece and the substrate against each other, wherein a temperature of the glass piece and a force exerted on the glass piece are controlled such that fluidified glass material re-solidifies and the re-solidified glass material is bonded to the substrate.

7. The method according to claim 1, wherein:
the glass piece comprises a protrusion forming a grid matching with the grid formed by the cavity.

8. The method according to claim 1, wherein the thinning stops at a buried edge of the glass piece.

9. The method according to claim 1, further comprising forming, before the bonding, at least one auxiliary layer lining the cavity, the at least one auxiliary layer forming an electric passivation layer lining the cavity, a moisture passivation layer lining the cavity, a getter layer lining the cavity, the getter layer being adapted to getter impurities, or an adhesive layer.

10. The method according to claim 9, wherein the thinning stops at one of the at least one auxiliary layers lining the cavity.

11. The method according to claim 1, further comprising implanting, from the rear side, dopants to form a field stop structure, an emitter region for an IGBT or a diode and/or a highly doped drain region for a power MOSFET after the thinning.

12. The method according to claim 1, further comprising providing, before the bonding, conductive structures on the working surface of the substrate.

13. The method according to claim 1, further comprising annealing, after the thinning, the substrate at a temperature of at least 400 degrees Celsius.

14. The method according to claim 1, further comprising removing, before the thinning, excess portions of the glass layer outside the cavities to expose the working surface of the substrate.

15. The method according to claim 14, further comprising adhesive bonding a carrier to the substrate after providing conductive structures on the exposed working surface.

16. The method according to claim 15, further comprising annealing, after removing the carrier, the substrate at a temperature of at least 400 degrees Celsius.

17. A wafer assembly, comprising:
a substrate comprising a power field effect transistor and a cavity forming a grid formed in a working surface of the substrate, the cavity extending along kerf areas, wherein the cavity is wider than the kerf areas; and
a glass piece consisting of or comprising a protrusion that at least partly fills the cavity, the glass piece being bonded to the substrate and forming a grid matching with the grid formed by the cavity.

18. The wafer assembly according to claim 17, wherein the protrusion fills the cavity completely.

19. The wafer assembly according to claim 17, wherein the substrate is in-situ bonded to the glass piece.

20. The wafer assembly according to claim 17, further comprising an adhesive layer arranged between the substrate and the glass piece, the adhesive layer adhesive bonding the glass piece with the substrate.

21. The wafer assembly according to claim 17, wherein the cavity has a width of 10 micrometers of greater.

22. The wafer assembly according to claim 17, wherein the cavity has inclined sidewalls.

23. A method of manufacturing a power semiconductor device, comprising:
forming a cavity in a working surface of a substrate in which a power field effect transistor is formed; and
bonding a glass piece formed from a glass material to the substrate, wherein the glass piece is pre-patterned with a protrusion matching with the cavity and the cavity is at least partly filled with the glass material, and the bonding comprises:
arranging the glass material in contact with the working surface of the substrate;
pressing the glass material and the substrate against each other, wherein a temperature of the glass material and a force exerted on the glass material are controlled such that fluidified glass material flows into the cavity; and
controlling the temperature and the force to re-solidify the fluidified glass material, the re-solidified glass material forming the glass piece with a protrusion extending into the cavity, wherein the glass piece is in-situ bonded to the substrate.

24. The method of claim 23, wherein the glass piece is adhesive bonded to the substrate through an adhesive material provided between the substrate and the glass piece before the bonding.

* * * * *

UNITED STATES PATENT AND TRADEMARK OFFICE
CERTIFICATE OF CORRECTION

Page 1 of 1

PATENT NO. : 9,219,020 B2
APPLICATION NO. : 13/415340
DATED : December 22, 2015
INVENTOR(S) : A. Breymesser et al.

It is certified that error appears in the above-identified patent and that said Letters Patent is hereby corrected as shown below:

In the Claims

Column 14, line 17 (claim 21, line 2) please change "micrometers of greater" to -- micrometers or greater --

Signed and Sealed this
Tenth Day of May, 2016

Michelle K. Lee
*Director of the United States Patent and Trademark Office*